(12) United States Patent
Sul et al.

(10) Patent No.: US 9,148,599 B2
(45) Date of Patent: *Sep. 29, 2015

(54) IMAGE SENSOR, CONFIGURED TO REGULATE A QUANTITY OF LIGHT ABSORBED THEREBY, ELECTRONIC DEVICE INCLUDING THE SAME, AND IMAGE SENSING METHOD

(71) Applicant: Samsung Electronics Co., Ltd., Suwon-Si, Gyeonggi-Do (KR)

(72) Inventors: Sang Chul Sul, Suwon-si (KR); Hirosige Goto, Suwon-si (KR); Kyung Ho Lee, Bucheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/579,857

(22) Filed: Dec. 22, 2014

(65) Prior Publication Data

US 2015/0156437 A1 Jun. 4, 2015

Related U.S. Application Data

(63) Continuation of application No. 13/618,076, filed on Sep. 14, 2012, now Pat. No. 8,953,073.

(30) Foreign Application Priority Data

Oct. 17, 2011 (KR) .................. 10-2011-0105638

(51) Int. Cl.
*H04N 5/3745* (2011.01)
*H04N 5/378* (2011.01)

(52) U.S. Cl.
CPC ............. *H04N 5/3745* (2013.01); *H04N 5/378* (2013.01)

(58) Field of Classification Search
CPC .... H04N 5/374; H04N 5/3559; H04N 3/1506
USPC .......................................... 348/297, 302, 308
See application file for complete search history.

(56) References Cited

U.S. PATENT DOCUMENTS

2007/0040922 A1 2/2007 McKee et al.
2009/0046185 A1 2/2009 Ota (Continued)

FOREIGN PATENT DOCUMENTS

JP 2010219974 A 9/2010
JP 2011035207 A 2/2011

(Continued)

*Primary Examiner* — Kelly L Jerabek
(74) *Attorney, Agent, or Firm* — Harness, Dickey & Pierce, P.L.C.

(57) ABSTRACT

An image sensor and an image sensing method are provided. The image sensor includes a semiconductor substrate; a photoelectric converter comprising a bias unit, which comprises a first electrode and a second electrode, and an organic photoelectric conversion layer, which selectively absorbs light and converts the light into electrons; a via contacting the second electrode to connect the photoelectric converter with the semiconductor substrate; a storage node configured to store electrons; a read-out unit to converts charge transferred from the storage node into an image signal; a pixel array comprising a plurality of pixels, each of which comprises an intermediate insulating layer; and an output circuit configured to read out the image signal from the pixel array. The quantity of light received by the organic photoelectric conversion layer is adjusted by a bias change of the bias unit.

21 Claims, 16 Drawing Sheets

(56) References Cited

U.S. PATENT DOCUMENTS

| | | |
|---|---|---|
| 2010/0238332 A1 | 9/2010 | Watanabe |
| 2011/0216212 A1 | 9/2011 | Watanabe et al. |
| 2012/0026370 A1 | 2/2012 | Oike et al. |

FOREIGN PATENT DOCUMENTS

| | | |
|---|---|---|
| KR | 1020080037109 A | 4/2008 |
| KR | 1020100105392 A | 9/2012 |

IMAGE SENSOR, CONFIGURED TO REGULATE A QUANTITY OF LIGHT ABSORBED THEREBY, ELECTRONIC DEVICE INCLUDING THE SAME, AND IMAGE SENSING METHOD

CROSS-REFERENCE TO RELATED APPLICATIONS

This application is a continuation application of U.S. application Ser. No. 13/618,076, filed Sep. 14, 2012, which claims priority under 35 U.S.C. §119(a) from Korean Patent Application No. 10-2011-0105638 filed on Oct. 17, 2011, the disclosure of each of which is hereby incorporated by reference in their entirety.

BACKGROUND

Embodiments of the inventive concepts relate to an image sensor, and more particularly, to an image sensor including a pixel circuit array that operates using a global shutter without a mechanical shutter.

A complementary metal oxide semiconductor (CMOS) image sensor is a device that is installed in a portable phone camera, a digital still camera and so on to convert a scene unfolded to the sight into a screen image through a display device.

In detail, the CMOS image sensor converts a scene into an electrical signal using a photoelectric element, converts the electrical signal into a digital image signal, and sends the digital image signal to a display device such as a liquid crystal display (LCD). The digital image signal output from the CMOS image sensor is image data of red (R), green (G) and Blue (B).

The photoelectric element is a device that generates photocharge in proportion to the quantity of incident light. A photodiode is an example of the photoelectric element. When very strong light is applied to the photodiode, photocharges above a capacity that the photodiode can store therein may be generated. As a result, the photocharges may overflow the photodiode and the excess overflow charges may affect adjacent pixels resulting in a distorted image.

The distorted image may be a white image or an indiscernible image. Such a phenomenon that brings aberration into an output image is called a blooming phenomenon.

In order to prevent the blooming phenomenon that occurs due to very strong light, a mechanical shutter is used to adjust the quantity of light applied to the photoelectric element.

However, when the mechanical shutter is used, manufacturing cost and the size of an image device increase and an operating cycle is limited. Accordingly, the mechanical shutter is used in high-grade cameras and is generally not used in low-price compact cameras.

For low-price or compact cameras in which the mechanical shutter is not used, a pixel circuit having a global shutter function performing a global shutter operation has been developed. In the global shutter operation, all photoelectric elements in a frame simultaneously receive light, all signals from the photoelectric elements are transferred to a floating diffusion layer at a time, and then image signals corresponding to a row, which is sequentially selected, are output.

SUMMARY

Some embodiments of the inventive concepts provide a pixel circuit array for guaranteeing or improving the quality of picture, a pixel circuit for realizing a global shutter without increasing an area, and/or an image sensor including the same.

According to some embodiments of the inventive concepts, there is provided an image sensor including a semiconductor substrate; a photoelectric converter including a bias unit, which includes a first electrode and a second electrode that are formed separate from each other on the semiconductor substrate, and an organic photoelectric conversion layer, configured to selectively absorb a quantity of light in a visible wavelength range and convert the light into electrons through photoelectric conversion, the quantity of light absorbed being adjusted by a bias change of the bias unit; a via contacting the second electrode to connect the photoelectric converter with the semiconductor substrate; a storage node configured to store electrons; a read-out unit formed within the semiconductor substrate configured to convert charge transferred from the storage node into an image signal; a pixel array including a plurality of pixels, each having an intermediate insulating layer provided between the photoelectric converter and the semiconductor substrate; and an output circuit configured to read out the image signal from the pixel array. The bias unit may adjust the quantity of light absorbed sequentially in units of pixels in the pixel array, adjust the quantity of light absorbed sequentially in units of rows in the pixel array, and adjust the quantity of light absorbed in order.

According to other embodiments of the inventive concepts, there is provided an image sensing method including selectively absorbing in an organic photoelectric conversion layer formed between a pair of electrodes a quantity of light in a visible wavelength range by changing a bias between the pair of electrodes; and generating an image signal by accumulating and reading out electrons in accordance with the change in the bias between the pair of electrodes.

The change in the bias may be performed by one of sequentially in units of pixels in a pixel array, sequentially in units of rows in the pixel array and in order.

The generating may include accumulating and storing the electrons if the pair of electrodes have a first bias; stopping the accumulation if the pair of electrodes have a second bias; and reading out the stored electrons if a semiconductor substrate has a higher voltage than a closest one of the pair of electrodes.

The first bias may be a voltage level where a voltage of a upper electrode of the pair of electrodes may be less than a voltage of a lower electrode of the pair of electrodes so that the first bias has a positive value, and the second bias may be a voltage level where the voltage of the upper electrode may be greater than the voltage of the lower electrode.

According to other example embodiments, there is provided an image sensor including a lens configured to receive an image; and a pixel array configured to demodulate the image into charges representing image information. The pixel array including a plurality of pixels. Each of the plurality of pixels including a photoelectric converter, a plurality of storage nodes and a plurality of read out units. The photoelectric converter configured to adjust a quantity of photons that are converted into electrons. The photoelectric converter including a bias unit including at least first and second electrodes formed parallel to each other and configured to generate a bias voltage therebetween, and a photodiode formed between the first and second electrodes. The photodiode configured to convert the quantity of photons received into the charges through photoelectric conversion based on the bias voltage. The plurality of storage nodes configured to store the charges. Each of the plurality of read out units configured to amplify the charges to form an image signal.

BRIEF DESCRIPTION OF THE DRAWINGS

The above and other features and advantages of the inventive concepts will become more apparent by describing in detail exemplary embodiments thereof with reference to the attached drawings in which.

DETAILED DESCRIPTION OF THE EMBODIMENTS

Figure 1:
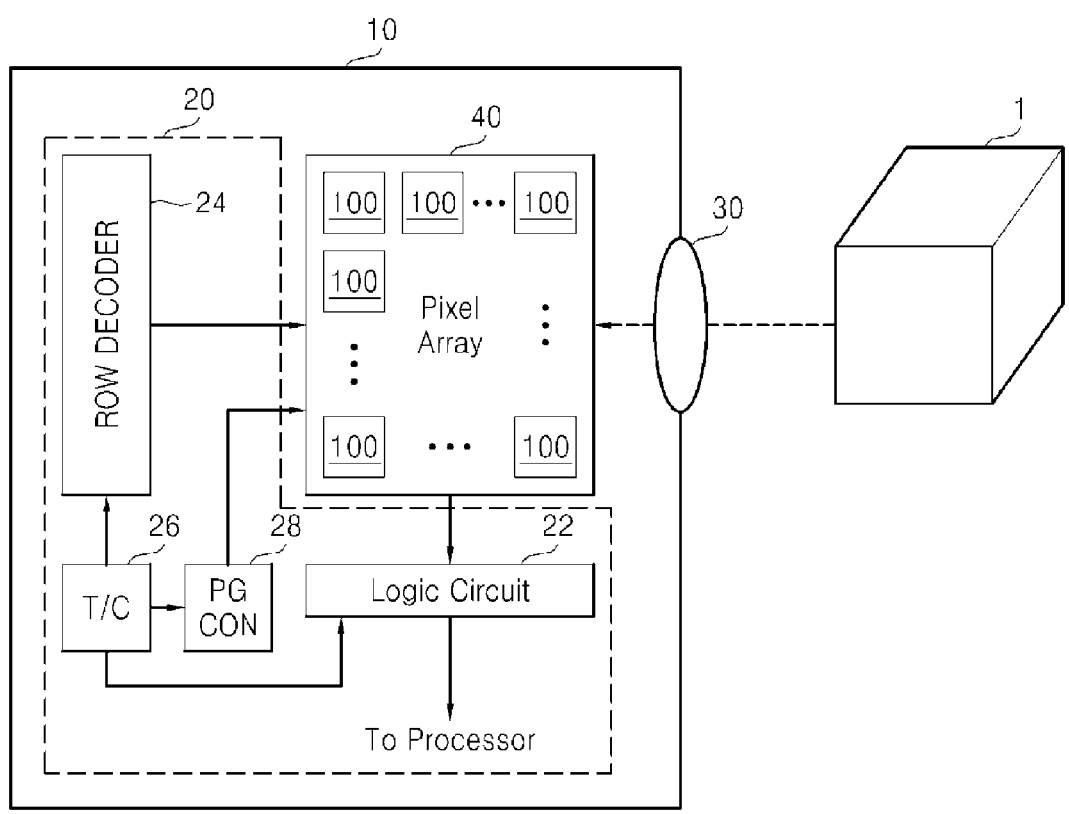
FIG. 1 is a block diagram of an image sensor according to some embodiments of the inventive concepts.

The inventive concepts now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventions. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Image sensors according to some embodiments of the inventive concepts include either a charge coupled device (CCD) image sensor or a complementary metal oxide semiconductor (CMOS) image sensor.

The CCD image sensor has relatively less noise and higher picture quality than the CMOS image sensor, but it requires a high voltage and high manufacturing cost. The CMOS image sensor has a relatively simple operation mode and can be realized in various scanning modes. In addition, since a signal processing circuit is integrated into a single chip, products using the CMOS image sensor can be made having a small size. Since CMOS process technology can be used, manufacturing cost is also reduced. The CMOS image sensor has very low power consumption, thus can be easily applied to products having limited battery capacity. Accordingly, hereinafter, The CMOS image sensor is used as an example of an image sensor in embodiments of the inventive concepts. However, the inventive concepts can be applied to CCD image sensors.

Hereinafter, the inventive concepts will be described in detail by explaining the embodiments with reference to the drawing.

FIG. 1 is a block diagram of an image sensor 10 according to some embodiments of the inventive concepts. The image sensor 10 includes a pixel array 40, an output circuit 20, and a lens module 30.

The pixel array 40 includes a plurality of pixels 100 that will be described in more detail with reference to FIG. 2.

The output circuit 20 includes a row decoder 24, a timing controller 26, a photo gate controller 28, and a logic circuit 22 to read out image information sensed by the pixel array 40.

The row decoder 24 selects a row among a plurality of rows in response to a row address output from the timing controller 26. The row refers to a group of depth pixels arranged in an X-direction in the pixel array 40.

The photo gate controller 28 may generate a plurality of photo gate control signals and provide them to the pixel array 40 under the control of the timing controller 26.

The timing controller 26 may control the logic circuit 22 to process signals sensed by the pixels 100 implemented in the pixel array 40 and output processed signals to a processor (not shown). The processor may output an image to be displayed based on the processed signals. The processor may be implemented in a separate chip from the image sensor 10.

The logic circuit 22 may include an analog-to-digital converter (ADC) block (not shown) that converts the sensed signals output from the pixel array 40 into digital signals. The logic circuit 22 may also include a correlated double sampling (CDS) block (not shown) that performs CDS on the digital signals output from the ADC block.

Alternatively, the logic circuit 22 may include a CDS block that performs CDS on the sensed signals output from the pixel array 40 and an ADC block that converts CDS signals output from the CDS block into digital signals.

In addition, the logic circuit 22 may also include a column decoder that outputs signals from the ADC block or the CDS block to the processor under the control of the timing controller 26.

Optical signals representing an object 1 are input to the pixel array 40 via the lens module 30.

The optical signals input to the pixel array 40 may be demodulated by the pixels 100. In other words, the optical signals input to the pixel array 40 via the lens module 30 may form an image.

Figure 2:
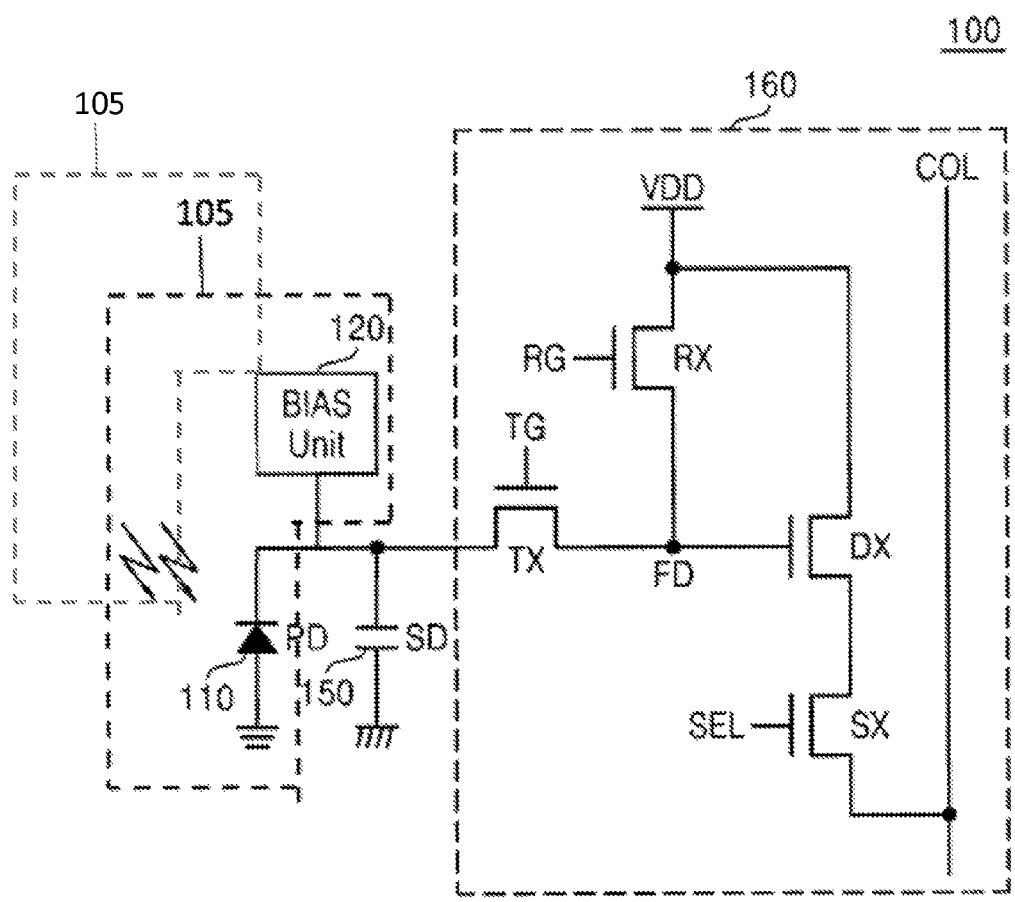
FIG. 2 is a circuit diagram of a pixel illustrated in FIG. 1.

FIG. 2 is a circuit diagram of a pixel 100 illustrated in FIG. 1. The pixel 100 includes a photodiode (PD) 110, a bias unit 120, a storage node (SD) 150, and a read-out unit 160. The read-out unit 160 includes a transfer transistor Tx, a floating diffusion region FD, a reset transistor Rx, a drive transistor Dx, and a select transistor Sx.

The photodiode 110 may include at least one of a photo transistor, a photo gate, a pinned photo diode (PPD), and a combination thereof.

The bias unit 120 adjusts the quantity of light received by the photodiode 110 by changing a voltage, i.e., a bias applied to the photodiode 110. The bias unit 120 is controlled sequentially in units of pixels or rows in the pixel array 40 or in predetermined order to adjust the quantity of light received by an organic photoelectric conversion layer, i.e., photodiode 110.

The photodiode 110 converts photons into charges having electrical characteristics according to the control of the bias unit 120 and stores the charges in the storage node 150.

Charges stored at the storage node 150 are transferred to the floating diffusion region FD when the transfer transistor Tx is turned on. A reset signal is applied to the reset transistor Rx before the charges are transferred. At this time, the floating diffusion region FD is reset to a predetermined charge level in response to the reset signal.

Charges transferred to the floating diffusion region FD after being reset are amplified into an electrical signal by the drive transistor Dx. When the select transistor Sx is turned on in response to a select signal SEL, the electrical signal is output as an image signal.

FIG. 2 illustrates a 4T-structure pixel including a single photodiode and four MOS transistors Tx, Rx, Dx, and Sx, but the inventive concepts are not restricted thereto. Embodiments of the inventive concepts may be applied to any circuit including at least the select transistor Sx and the photodiode.

Figure 3:
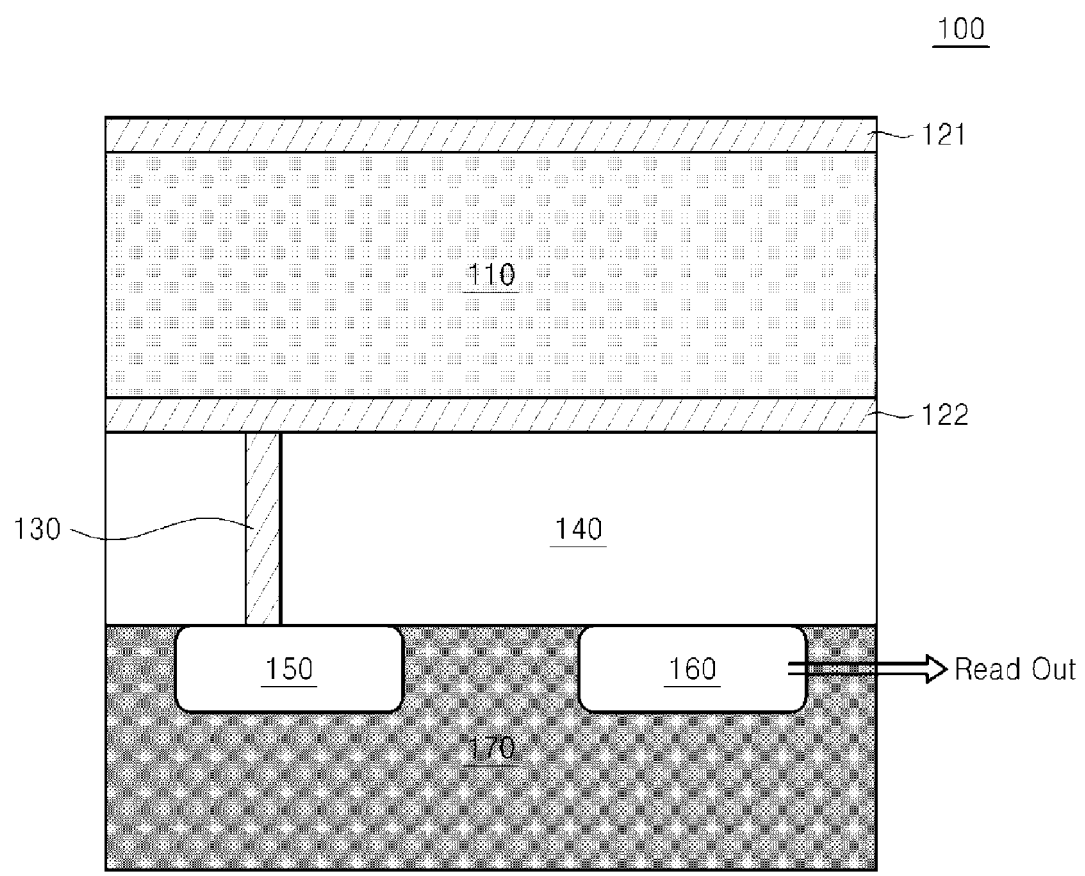
FIG. 3 is a cross-sectional view of a pixel according to some embodiments of the inventive concepts.

FIG. 3 is a cross-sectional view of the pixel 100 according to some embodiments of the inventive concepts. The pixel 100 includes a semiconductor substrate 170, the storage node 150, the read-out unit 160, an intermediate insulating layer 140, a via 130, and a photoelectric converter. Although not shown, the pixel 100 may also include a pad region in which a metal pad connecting to an external signal will be formed.

The semiconductor substrate 170 may be a silicon-on-insulator (SOI) substrate, a gallium arsenide (GaAs) substrate, a silicon germanium (SiGe) substrate, a ceramic substrate, a quartz substrate, or a display glass substrate. In addition, a P-type substrate is used for the semiconductor substrate 170. Although not shown, the semiconductor substrate 170 may have dual-layer structure in which a P-type epitaxial layer is grown on the P-type substrate.

An active pixel array formed in the pixel array 40 includes the pixels 100 arranged in two dimensions. Each pixel 100 may have the structure illustrated in FIGS. 2 and 3.

A photoelectric converter 105 includes the bias unit 120 and the organic photoelectric conversion layer 110.

The organic photoelectric conversion layer 110 transmits light in a particular wavelength range (e.g., one of R, G, and B ranges) of the visible spectrum and absorbs light in the remaining wavelength range. Color information is sensed by converting light in the wavelength range absorbed by the photodiode 110 into electrons.

The bias unit 120 includes at least a first electrode 121 and a second electrode 122. The first electrode 121 and the second electrode 122 are separated and parallel to each other and surround the organic photoelectric conversion layer 110 or surround both the organic photoelectric conversion layer 110 and the storage node 150 to apply a bias to the organic photoelectric conversion layer 110.

The first and second electrodes 121 and 122 may be formed using transparent conductive material. The work function of the first electrode 121 is greater than that of the second electrode 122. The first and second electrodes 121 and 122 may be transparent oxide electrodes formed using at least one oxide selected from indium tin oxide (ITO), indium zinc oxide (IZO), ZnO, SnO2, antimony-doped tin oxide (ATO), Al-doped zinc oxide (AZO), gallium-doped zinc oxide (GZO), TiO2, and fluorine-doped tin oxide (FTO). The first electrode 121 may be a thin metal film formed using at least one metal selected from among Al, Cu, Ti, Au, Pt, Ag, and Cr. When the first electrode 121 is formed of metal, it may be formed to a thickness of 20 nm or less in order to secure transparency.

The organic photoelectric conversion layer 110 is formed between the first and second electrodes 121 and 122. A photodiode is formed in the organic photoelectric conversion layer 110.

The organic photoelectric conversion layer 110 performs photoelectric conversion to generate charges corresponding to incident light in a particular wavelength range. In other words, electrons are generated in proportion to the quantity of sensed light (i.e., the quantity of received light). The electrons are confined in the photodiode 110 due to a gate barrier when a transfer gate TG of the transfer transistor TX is turned off. The electrons are transferred to the floating diffusion region FD through a channel region created at the bottom of the transfer gate TG when the transfer gate TG is turned on. The photodiode 110 may have a maximum impurity concentration of $1\times10^{17}$ to $1\times10^{18}$ atoms/cm3. However, doping concentration and position may vary with manufacturing processes and design.

The organic photoelectric conversion layer 110 may be formed of a material that selectively absorbs visible rays in light. In other words, it may be applied to each of blue, green and red pixels.

The organic photoelectric conversion layer 110 may have a PN junction structure that includes a P-type organic layer and an N-type organic layer. The P-type organic layer is formed below the first electrode 121. The N-type organic layer is formed below the P-type organic layer.

The P-type organic layer may be formed using a semiconductor material in which holes are carriers and may be formed using an organic material that selectively absorbs light in a wavelength range of a predetermined color and carries out photoelectric conversion of the absorbed light. The organic photoelectric conversion layer 110 may be formed using different organic materials for red, green and blue pixels, respectively, in order to selectively absorb and carry out photoelectric conversion on light in the wavelength range other than a predetermined color range For instance, in a blue pixel, a P-type or an N-type organic layer may be formed using a material that absorbs only blue light and carries out photoelectric conversion on the blue light.

For instance, a blue pixel photoelectric conversion layer may include a P-type organic layer formed by deposition of TPD, which is a material absorbs only blue light and raising photoelectric conversion, and an N-type organic layer formed by deposition of C60. In this structure, excitons are generated in the P-type organic layer by light incident onto a light receiving surface and the P-type organic layer selectively absorbs light within a wavelength range.

The photoelectric conversion layer may include a red pixel photoelectric conversion layer, a green pixel photoelectric conversion layer, and a blue pixel photoelectric conversion layer. At least one of the red, green and blue pixel photoelectric conversion layers forms the photoelectric converter together with the bias unit 120. A plurality of photoelectric converters may be disposed to be adjacent to one another in a horizontal direction or in a vertical direction.

The intermediate insulating layer 140 is formed below the photoelectric converter. In detail, the intermediate insulating layer 140 is formed below the photoelectric converter to cover the entire top surface of the semiconductor substrate 170 and fill empty space in which transistors are not formed. The intermediate insulating layer 140 may be a silicon oxide (SiO2) layer.

The via 130 is formed in the intermediate insulating layer 140 and connects the photoelectric converter with the semiconductor substrate 170. The via 130 transmits electrons generated in the photoelectric converter to the storage node 150.

Consequently, when the pixel 100 receives visible light, the light is converted into electrons in the organic photoelectric conversion layer 110 through a bias change between the first and second electrodes 121 and 122, and the electrons are transferred through the via 130 to the storage node 150 which stores the electronics to be used to sense color information. The color information is sensed by performing photoelectric conversion on light in the visible wavelength range that has been absorbed, converted and output through the storage node 150 and the read-out unit 160 as image information.

The pixel 100 may also include an insulation layer (not shown) between the organic photoelectric conversion layer 110 and each of the first and second electrodes 121 and 122.

The insulation layer is provided to prevent the interference of energy formed outside the organic photoelectric conversion layer 110 (e.g., dark current caused by electrons generated at the surface of the organic photoelectric conversion layer 110) by having a higher slope of a potential barrier than the organic photoelectric conversion layer 110.

Figure 4A:
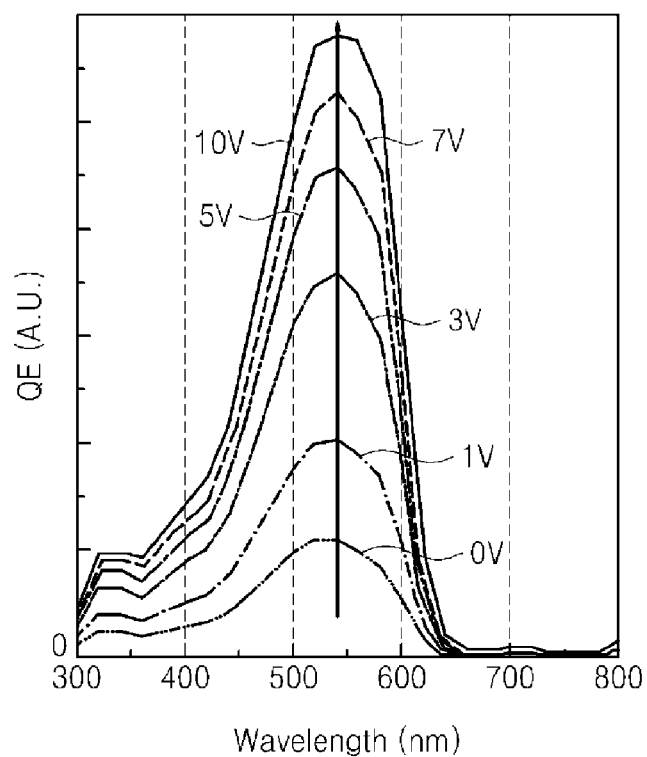
FIGS. 4A and 4B are graphs showing the change in the quantity of light received by an organic material with respect to the bias change in a range of visible wavelengths.
Figure 4B:
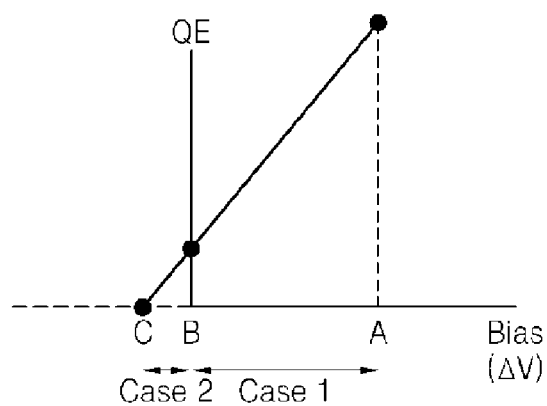

FIGS. 4A and 4B are graphs showing the change in the quantity of light received by an organic material with respect to the bias change in the range of visible wavelengths.

Referring to FIG. 4A, the quantity of received light, i.e., quantum efficiency (QE) changes with the bias change in a visible wavelength range of 300 to 800 nm. In particular, in a green wavelength range of 500 to 600 nm, the QE increases as the bias applied to the organic material increases from 0 to 10 V. Referring to FIG. 4B, the QE increases when a bias $\Delta V$ in a particular wavelength range (e.g., a green wavelength range) increases.

The bias voltage $\Delta V$ being equal to the difference between voltage level of the first electrode 121 and the second electrode 122.

When the bias $\Delta V$ is A through B (Case 1), the organic material selectively absorbs a large quantity of light in the visible wavelength range and converts the light into electrons.

When the bias $\Delta V$ is B through C (Case 2), the organic material absorbs a small quantity of the light or does not absorb the light.

Figure 5A:
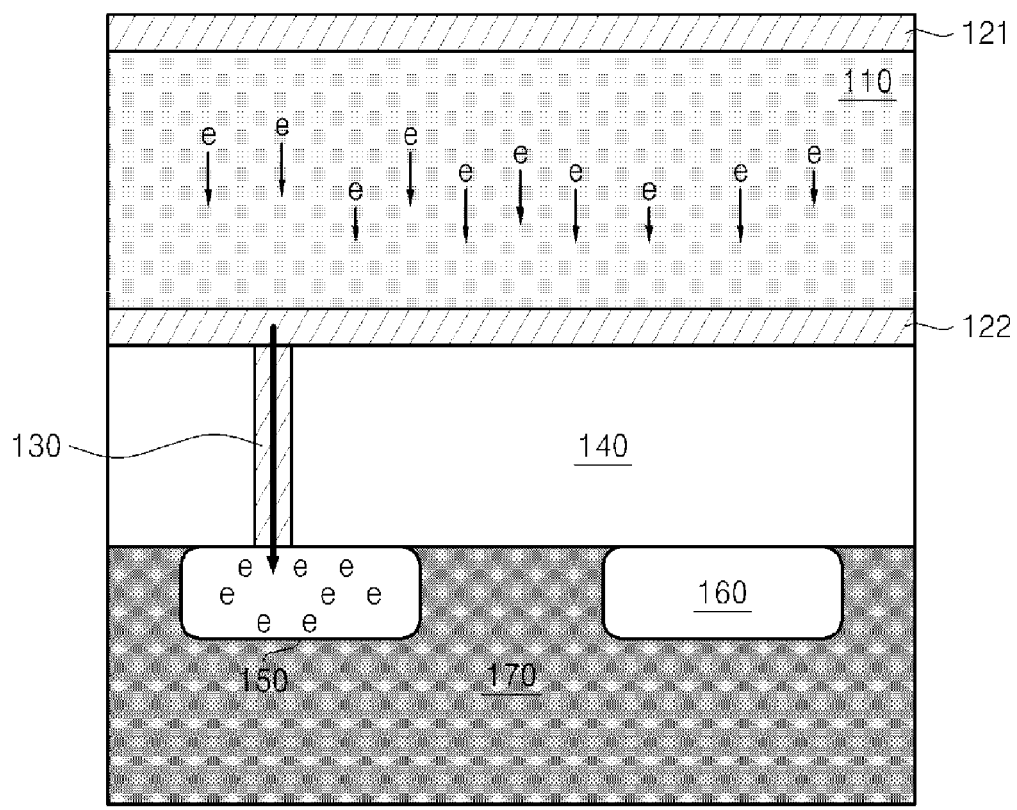
FIGS. 5A through 5C show the changes in the pixel illustrated in FIG. 3 with respect to the bias change.
Figure 5B:
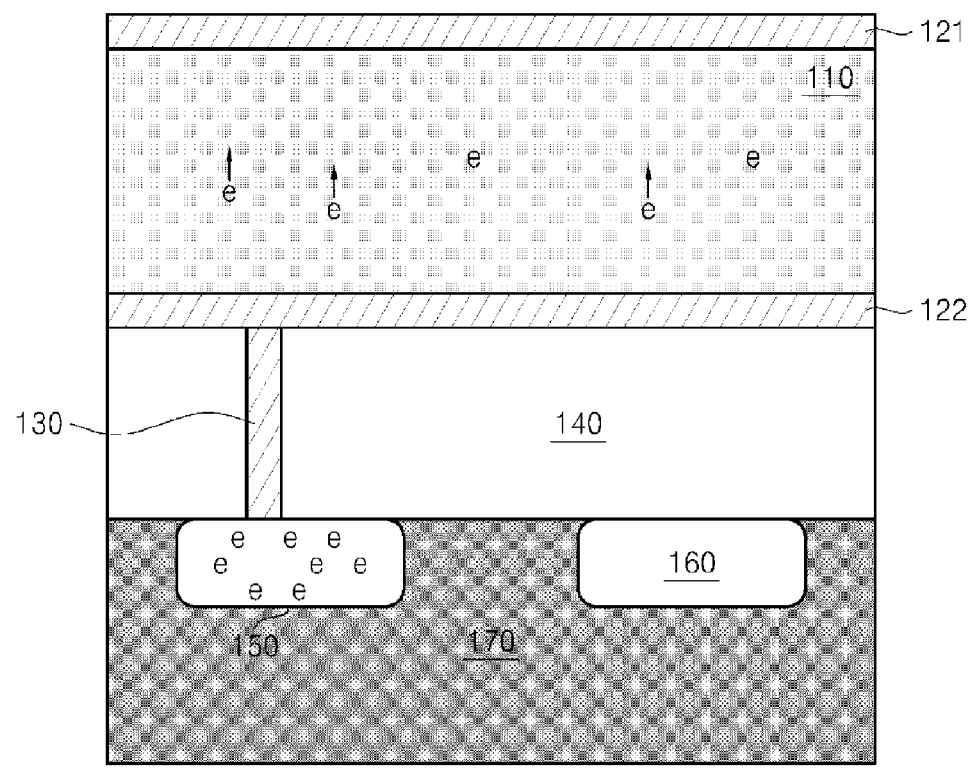
Figure 5C:
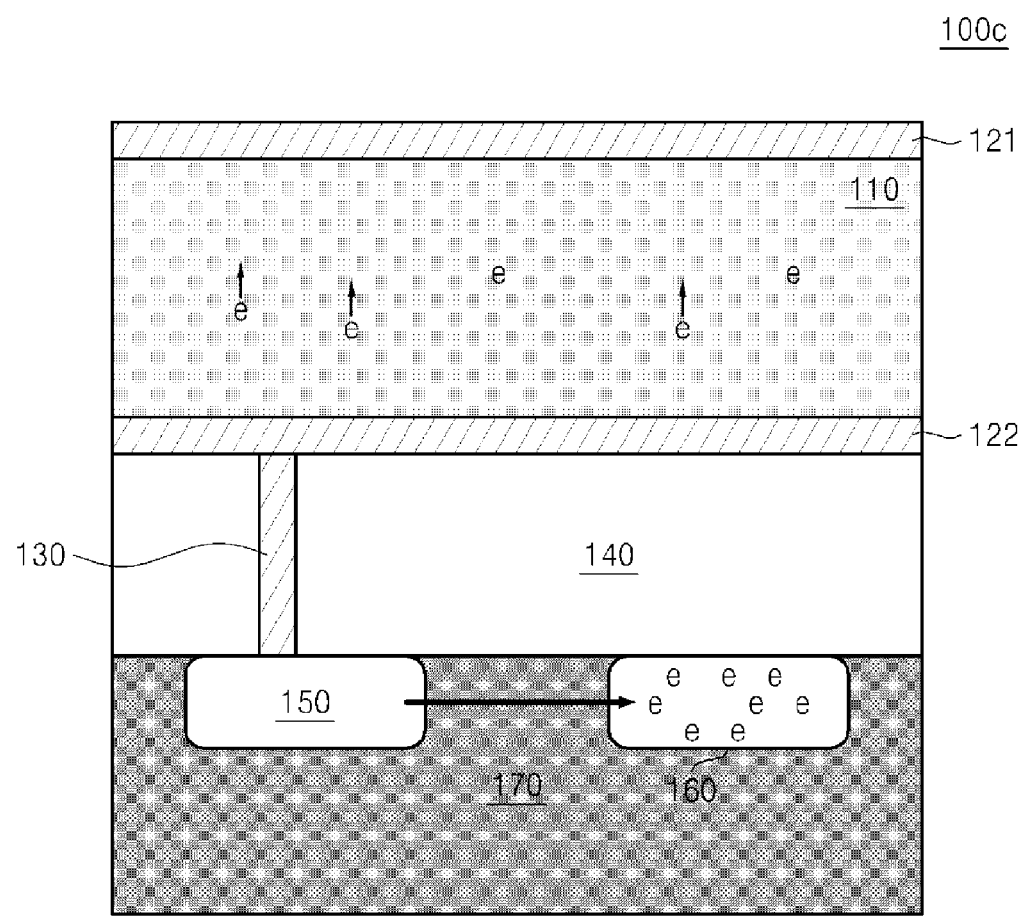

FIGS. 5A through 5C show the changes in the pixel 100 illustrated in FIG. 3 with respect to the bias change. Referring to FIG. 5A, when there is a first bias $\Delta V1$ in the bias unit 120, between the first and second electrodes 121 and 122, the organic photoelectric conversion layer 110 converts selectively absorbed visible light into electrons. The electrons are transmitted to the storage node 150 through the via 130.

At this time, the first bias $\Delta V1$ has a positive value (i.e., $\Delta V1>0$), which means that the voltage of the first electrode 121 is less than that of the second electrode 122. At this time, the semiconductor substrate 170 has a lower voltage than the second electrode 122.

For instance, when the first bias $\Delta V1$ is 3 V, that is, when $-3$ V and 0 V are respectively applied to the first and second electrodes 121 and 122, the electrons move to the second electrode 122 having the higher voltage. When $-1$ V is applied to the semiconductor substrate 170, the electrons in the second electrode 122 are transmitted to the storage node 150 through the via 130 and stored in the storage node 150.

Referring to FIG. 5B, when the bias unit 120 has a second bias $\Delta V2$, the light absorption of the organic photoelectric conversion layer 110 is reduced. In other words, the second bias $\Delta V2$ is changed to reduce the quantity of light received by the organic photoelectric conversion layer 110.

At this time, the second bias $\Delta V2$ is 0 or has a negative value (i.e., $\Delta V2 \leq 0$), which means that the voltage of the first electrode is greater than that of the second electrode 122.

For instance, when the second bias $\Delta V2$ is $-1$ V, that is, when 1 V and 0 V are respectively applied to the first and second electrodes 121 and 122, the quantity of light received by the organic photoelectric conversion layer 110 is reduced, and therefore, the amount of electrons is also reduced. At this time, excessive electrons generated in a small amount move to the first electrode having the higher voltage and are not stored in the storage node 150.

In addition, a voltage (e.g., 0 or $-1$ V) equal to or lower than the voltage of the second electrode 122 is applied to the semiconductor substrate 170, so that the small amount of excessive electrons are not transmitted to the storage node 150.

Referring to FIG. 5C, the bias unit 120 is maintained at the second bias $\Delta V2$ and the read-out unit 160 turns on the transfer transistor Tx. At this time, as is described in FIG. 5B, the second bias $\Delta V2$ is 0 or has a negative value (i.e., $\Delta V2 \leq 0$), which means that the voltage of the first electrode is greater than that of the second electrode 122.

The electrons that has been accumulated and stored in the storage node 150 are transmitted to the floating diffusion region FD when the transfer transistor Tx is turned on. At this time, the floating diffusion region FD is reset to a desired (or, alternatively a predetermined) charge level in response to a reset signal before the transmission of electrons.

The charge transmitted to the floating diffusion region FD is amplified to an electrical signal by the drive transistor Dx. The select transistor Sx outputs the electrical signal as an image signal in response to the select signal SEL.

A global shutter operation is realized by the image sensor 10 using the photoelectric converter including the organic photoelectric conversion layer 110 and the bias unit 120 that allows the change in a bias. This global shutter operation is realized without an increase of an area or a decrease of a fill factor, and without requiring an additional transistor. Since the global shutter operation is realized without the decrease of the fill factor, the quality of an image signal is secured to be at least a desired (or, alternatively a predetermined) level without decreasing the sensitivity of the image signal.

Figure 6:
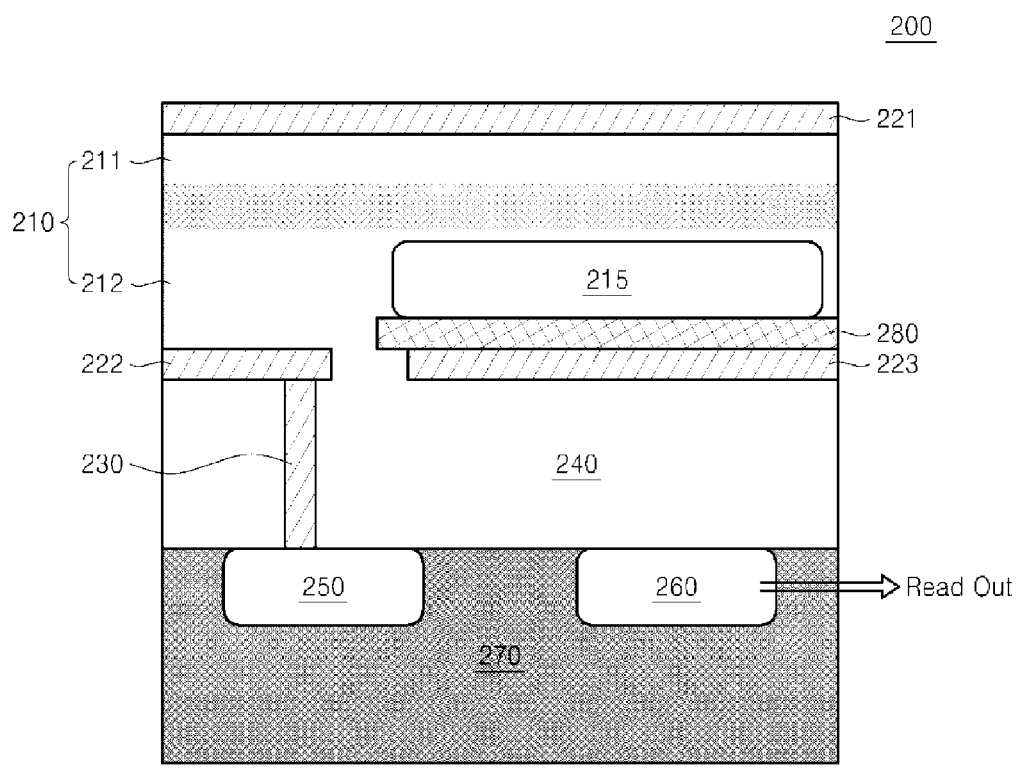
FIG. 6 is a cross-sectional view of a pixel according to other embodiments of the inventive concepts.

FIG. 6 is a cross-sectional view of a pixel 200 according to other embodiments of the inventive concepts. Referring to FIG. 6, the pixel 200 includes a semiconductor substrate 270, a connecting node 250, a read-out unit 260, an intermediate insulating layer 240, a via 230, and a photoelectric converter.

The photoelectric converter includes a bias unit, an organic photoelectric conversion layer 210, and an insulation layer 280. The bias unit includes a first electrode 221, a second electrode 222, and a third electrode 223.

Different biases may be applied to the first through third electrodes 221, 222, and 223, respectively. The second electrode 222 and the third electrode 223 are separated from the first electrode 221 to be parallel with the first electrode 221. The second electrode 222 and the third electrode 223 are formed to be in line and separated from each other on one plane.

The first through third electrodes 221, 222, and 223 may be formed using transparent conductive material. The work function of the first electrode 221 is greater than that of the second and third electrodes 222 and 223. The first through third electrodes 221, 222, and 223 may be formed using the same material as used to form the first and second electrodes 121 and 122 illustrated in FIG. 3.

The organic photoelectric conversion layer 210 is formed among the first through third electrodes 221, 222, and 22.

The organic photoelectric conversion layer 210 may be formed of a material that selectively absorbs visible rays in light. In other words, it may be applied to each of blue, green and red pixels.

The organic photoelectric conversion layer 210 may have a PN junction structure that includes a P-type organic layer 211 and an N-type organic layer 212. The P-type organic layer 211 is formed below the first electrode 221. The N-type organic layer 212 is formed below the P-type organic layer 211.

The P-type organic layer 211 may be formed using a semiconductor material in which holes are carriers and may be formed using an organic material that selectively absorbs light in a wavelength range of a predetermined color and carries out photoelectric conversion of the absorbed light. The P-type organic layer 211 may be formed using different organic materials for red, green and blue pixels, respectively, in order to selectively absorb and carry out photoelectric conversion on light in the wavelength range other than a predetermined color range.

For instance, a blue pixel may include the P-type organic layer 211 formed by deposition of TPD, which is a material absorbs only blue light and raising photoelectric conversion, and the N-type organic layer 212 formed by deposition of C60. In this structure, excitons are generated in the P-type organic layer 211 by light incident onto a light receiving surface and the P-type organic layer 211 selectively absorbs light in a desired (or, alternatively a predetermined) wavelength range.

The organic photoelectric conversion layer 210 may include a red pixel photoelectric conversion layer, a green pixel photoelectric conversion layer, and a blue pixel photoelectric conversion layer. Photoelectric converters, each of which includes a bias unit wrapping at least one of the red, green and blue pixel photoelectric conversion layers, may be disposed to be adjacent to one another in a horizontal direction or in a vertical direction.

The organic photoelectric conversion layer 210 may include a storage node 215. The storage node 215 may be formed in a potential well created by bias changes occurring in at least two of the first through third electrodes 221, 222, and 223. The storage node 215 will be described in detail with reference to FIGS. 7A through 7C.

The insulation layer 280 included in the photoelectric converter is formed between the third electrode 223 and the organic photoelectric conversion layer 210. The insulation layer 280 is provided to intensively integrate electrons generated in the organic photoelectric conversion layer 210 on the storage node 215 by having a higher slope of a potential barrier than the organic photoelectric conversion layer 210.

The intermediate insulating layer 240 is formed below the photoelectric converter. In detail, the intermediate insulating layer 240 is formed below the photoelectric converter to cover the entire top surface of the semiconductor substrate 270 and fill empty space in which transistors are not formed. The intermediate insulating layer 240 may be a silicon oxide (SiO2) layer.

The via 230 is formed in the intermediate insulating layer 240 and connects the photoelectric converter with the semiconductor substrate 270. The via 230 transmits electrons generated in the photoelectric converter to the connecting node 250.

The electrons transmitted to the connecting node 250 are transferred to the read-out unit 260 according to the on/off of the transfer transistor Tx and are output as image information.

Figure 7A:
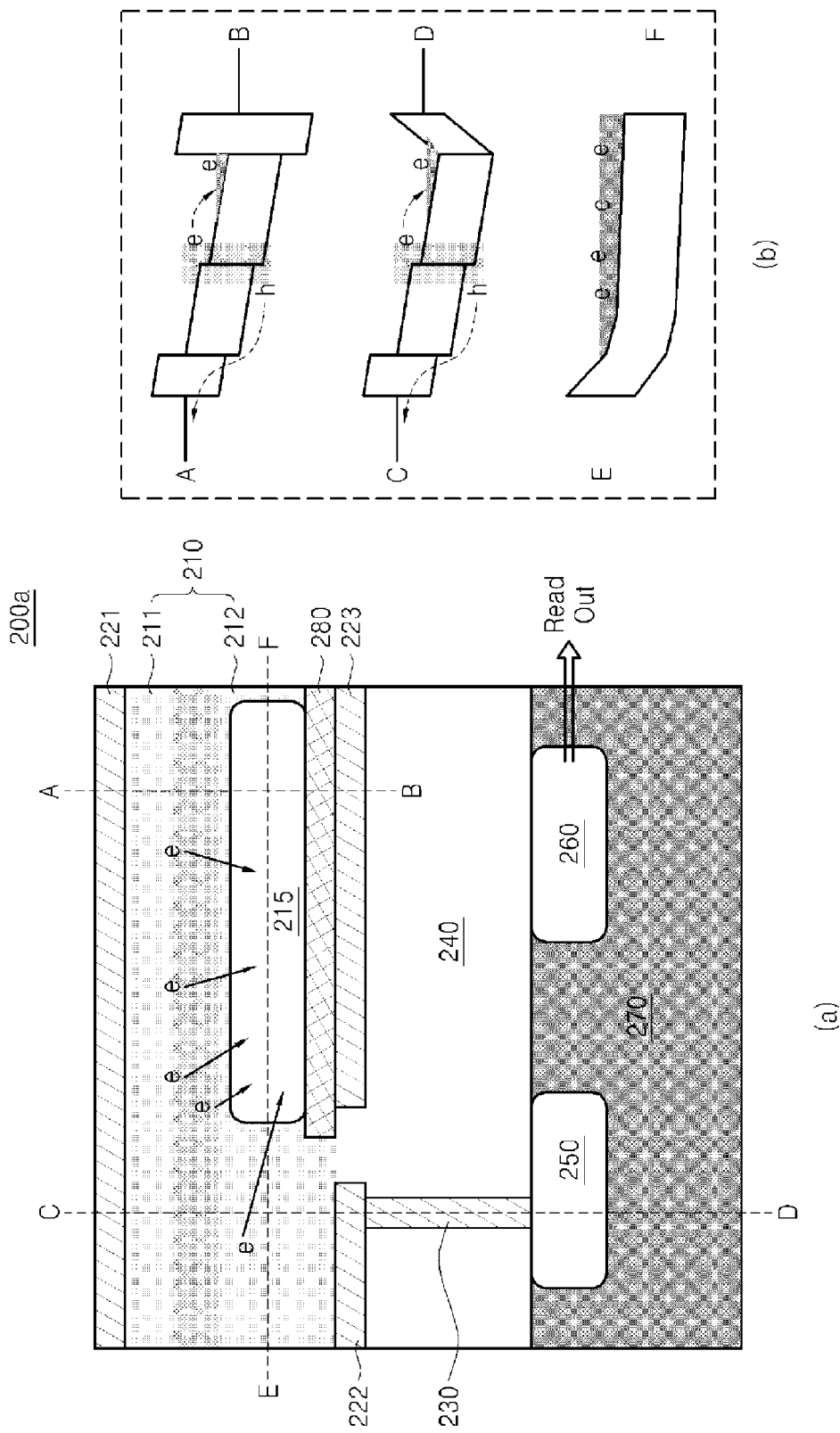
FIG. 7A through 7C show the changes in the pixel illustrated in FIG. 6 with respect to the bias change.
Figure 7B:
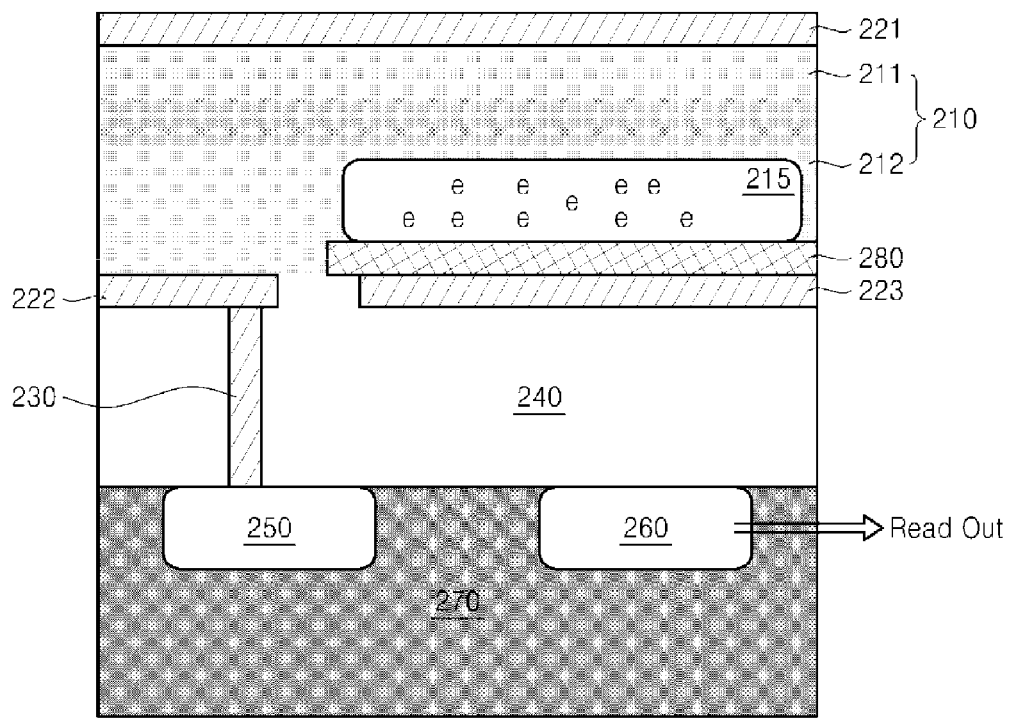
Figure 7C:
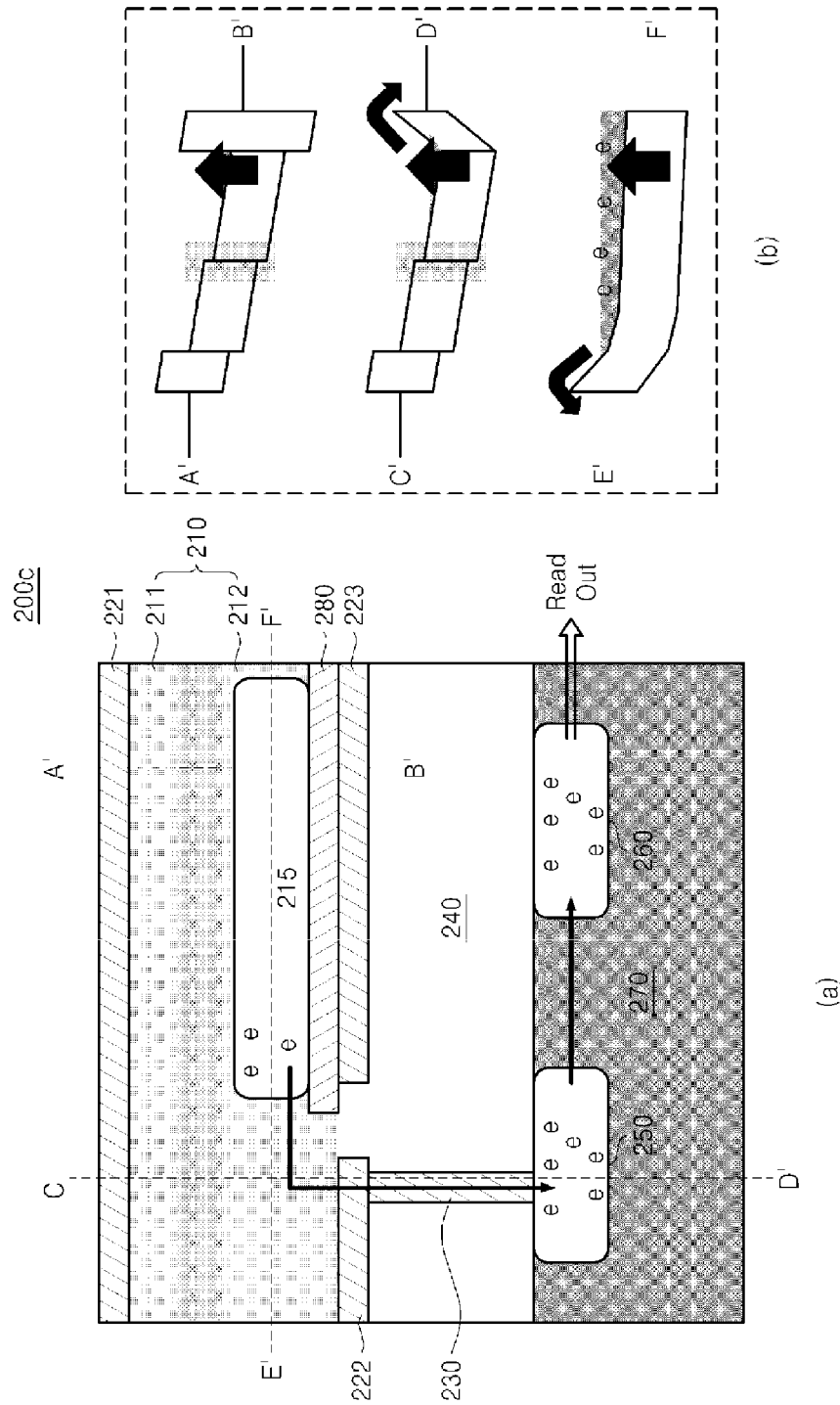

FIG. 7A through 7C show the changes in the pixel 200 illustrated in FIG. 6 with respect to the bias change. For clarity of the description, in the bias unit 220 of the pixel 200, a bias between the first and second electrodes 221 and 222 is referred to as a first vertical bias $\Delta Va$, a bias between the first and third electrodes 221 and 223 is referred to as a second vertical bias $\Delta Vb$, a bias between the second and third electrodes 222 and 223 is referred to as a horizontal bias $\Delta Vc$, and a bias between the second electrode 222 and the substrate 270 is referred to as a third vertical bias $\Delta Vd$.

FIG. 7A shows a cross-sectional view (a) of a unit pixel 200a and a potential energy diagram (b) of the unit pixel 200a.

Referring to the cross-sectional view (a), the unit pixel 200a has the first vertical bias $\Delta Va$ and the second vertical bias $\Delta Vb$ that have a positive value (i.e., $\Delta Va>0$ and $\Delta Vb>0$). When the voltage of the first electrode 221 is less than that of the second electrode 222 and is less than the bias of the third electrode 223, the organic photoelectric conversion layer 210 converts selectively absorbed visible light into electrons.

At this time, the second vertical bias $\Delta Vb$ is greater than the first vertical bias $\Delta Va$. The electrons are accumulated in the storage node 215 due to a difference between the first vertical bias $\Delta Va$ and the second vertical bias $\Delta Vb$ and a potential energy difference of the insulation layer 280. At this time, the semiconductor substrate 270 has a voltage lower than or equal to the voltage of the second electrode 222, so that the electrons are not transmitted to the connecting node 250.

For instance, it is assumed that −2, 0 and 2 V are respectively applied to the first through third electrodes 221, 222, and 223 and 0 V is applied to the semiconductor substrate 270. In other words, the first vertical bias $\Delta Va$ is 2 V, the second vertical bias $\Delta Vb$ is 4 V, the horizontal bias $\Delta Vc$ is −2 V, and the third vertical bias $\Delta Vd$ is 0 V.

The electrons generated in the organic photoelectric conversion layer 210 move toward the second and third electrodes 222 and 223 having the higher biases. Since the voltage of the third electrode 223 is greater than the voltage of the second electrode 222 due to the horizontal bias $\Delta Vc$, the electrons are more likely to move toward the third electrode 223. Due to the insulation layer 280 having a higher potential barrier than the third electrode 223, the electrons are intensively integrated at the storage node 215 positioned on the insulation layer 280 without leaking into other places.

As shown in the potential energy diagram (b), when the organic photoelectric conversion layer 210 includes the P-type organic layer 211 and the N-type organic layer 212 that have a PN junction therebetween, electrons "e" are generated at the PN junction through photoelectric conversion and move toward the second and third electrodes 222 and 223 and holes "h" move in an opposite direction to the movement of the electrons "e", that is, the holes "h" move toward the first electrode 221 (shown in the cross-sections A-B and C-D).

In the potential energy diagram of the cross section A-B, a high potential barrier is formed since the insulation layer 280 is formed on the third electrode 223. In the potential energy diagram of the cross section C-D, a relatively lower potential barrier is formed since the insulation layer 280 is not formed on the second electrode 222. As shown in the potential energy diagram of a cross section E-F, more electrons "e" move toward the third electrode 223 than toward the second electrode 222 since voltages are respectively applied to the second and the third electrodes 222 and 223 so that the potential energy of the second electrode 222 is higher than that of the third electrode 223.

Referring to FIG. 7B, a unit pixel 200b has the first vertical bias $\Delta Va$ and the second vertical bias $\Delta Vb$ that have a value of 0 or less (i.e., $\Delta Va \leq 0$ and $\Delta Vb \leq 0$). When the voltage of the first electrode 221 is greater than that of the second electrode 222 and that of the third electrode 223, the quantity of light received by the organic photoelectric conversion layer 210 is reduced.

At this time, the second vertical bias $\Delta Vb$ is more than the first vertical bias $\Delta Va$. The electrons that have been accumulated in the storage node 215 stay in the storage node 215 due to a difference between the first vertical bias $\Delta Va$ and the second vertical bias $\Delta Vb$ and a potential energy difference of the insulation layer 280. At this time, a voltage lower than or equal to the voltage of the second electrode 222 is applied to the semiconductor substrate 270 so that the electrons in the storage node are not transmitted to the connecting node 250.

For instance, it is assumed that 2, 0 and 2 V are respectively applied to the first through third electrodes 221, 222, and 223 and 2 V is applied to the semiconductor substrate 270. In other words, the first vertical bias $\Delta Va$ between the first and second electrodes 221 and 222 is −2 V, the second vertical bias $\Delta Vb$ between the first and third electrodes 221 and 223 is 0 V, the horizontal bias $\Delta Vc$ between the second and third electrodes 222 and 223 is −2 V, and the third vertical bias $\Delta Vd$ between the second electrode 222 and the substrate 270 is 0 V.

The electrons generated in the organic photoelectric conversion layer 210 gather above the insulation layer 280 according to potential energy formed due to voltage differences. Since the horizontal bias $\Delta Vc$ is maintained at −2 V and the third vertical bias $\Delta Vd$ is maintained at 0 V, the electrons do not move to the connecting node 250.

FIG. 7C shows a cross-sectional view (a) of a unit pixel 200c and a potential energy diagram (b) of the unit pixel 200c.

Referring to the cross-sectional view (a) in FIG. 7C, the unit pixel 200c has the first through third vertical biases $\Delta Va$, $\Delta Vb$, and $\Delta Vd$ and the horizontal bias $\Delta Vc$ that have a positive value (i.e., $\Delta Va > 0$, $\Delta Vb > 0$, $\Delta Vd > 0$, and $\Delta Vc > 0$).

At this time, the second vertical bias $\Delta Vb$ is less than the first vertical bias $\Delta Va$. The electrons accumulated in the storage node 215 move toward the second electrode 222 due to a potential energy difference between the first vertical bias $\Delta Va$ and the second vertical bias $\Delta Vb$. At this time, a voltage higher than the voltage of the second electrode 222 is applied to the semiconductor substrate 270 so that the electrons are transmitted to the connecting node 250.

For instance, it is assumed that −2, 2 and 0 V are respectively applied to the first through third electrodes 221, 222, and 223 and 4 V is applied to the semiconductor substrate 270. In other words, the first vertical bias $\Delta Va$ between the first and second electrodes 221 and 222 is 4 V, the second vertical bias $\Delta Vb$ between the first and third electrodes 221 and 223 is 2 V, the horizontal bias $\Delta Vc$ between the second and third electrodes 222 and 223 is 2 V, and the third vertical bias $\Delta Vd$ between the second electrode 222 and the substrate 270 is 2 V.

The electrons accumulated in the storage node 215 due to the horizontal bias $\Delta Vc$ move toward the second electrode 222.

As shown in the potential energy diagram (b) in FIG. 7C, when the organic photoelectric conversion layer 210 includes the P-type organic layer 211 and the N-type organic layer 212 that have a PN junction therebetween, electrons "e" accumulated in the storage node 215 move toward the first electrode 221 since the second vertical bias $\Delta Vb$ is less than the first vertical bias $\Delta Va$ (shown in the cross-sections A'-B' and C'-D'), which is opposite to the state shown in the potential energy diagram (b) in FIG. 7A.

In the potential energy diagram of the cross section A'-B', a high potential barrier is formed since the insulation layer 280 is formed on the third electrode 223. In the potential energy diagram of the cross section C'-D', a relatively lower potential barrier is formed since the insulation layer 280 is not formed on the second electrode 222. Accordingly, the electrons "e" are blocked by the potential barrier of the third electrode 223 and thus move to the second electrode 222 and then to the connecting node 250 due to the third vertical bias $\Delta Vd$.

As shown in the potential energy diagram of a cross section E'-F', the electrons "e" move from the second electrode to the connecting node 250 through the via 230 due to voltages respectively applied to the second electrode 222 and the semiconductor substrate 270.

The electrons "e" are transferred from the connecting node 250 to the floating diffusion region FD within the read-out unit 260 when the transfer transistor Tx is turned on. At this time, the floating diffusion region FD is reset to a desired (or, alternatively a predetermined) charge level in response to a reset signal before the transfer of the electrons "e".

Charge transferred to the floating diffusion region FD is amplified to an electrical signal by the drive transistor Dx. The electrical signal is output as an image signal when the select transistor Sx is turned on in response to the select signal SEL.

Figure 8:
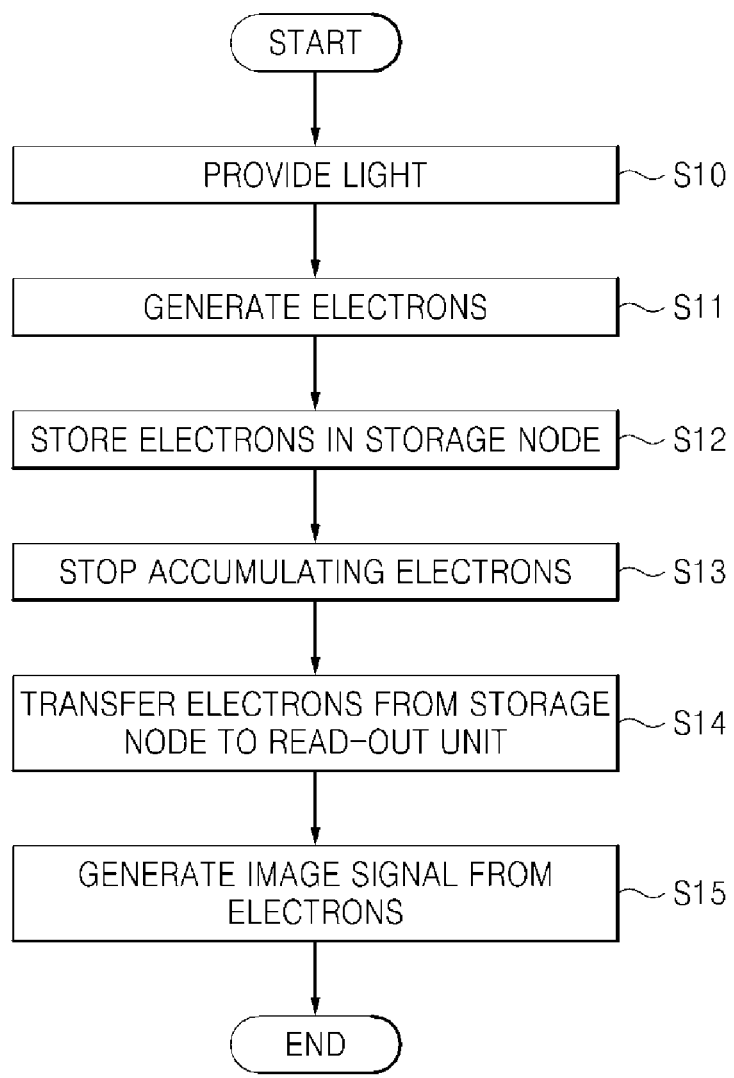
FIG. 8 is a flowchart of an image sensing method according to some embodiments of the inventive concepts.

FIG. 8 is a flowchart of an image sensing method according to some embodiments of the inventive concepts. Referring to FIG. 8, visible light is provided to an image sensor in operation S10. The image sensor selectively absorbs light in a visible wavelength range.

In the image sensor, an organic photoelectric conversion layer generates electrons in accordance with the change in a bias applied to a bias unit in operation S11. When a pair of top and bottom electrodes, which are respectively provided at the top and bottom of the organic photoelectric conversion layer to be separated from each other, have a first bias $\Delta V1$, the electrons generated in the organic photoelectric conversion layer are accumulated and stored in a storage node in operation S12. When the pair of electrodes have a second bias $\Delta V2$, the accumulation of electrons is stopped in operation S13.

When a substrate has a voltage higher than the bottom electrode, the electrons stored in the storage node are transferred to a read-out unit in operation S14. An image signal is generated from the electrons in operation S15. At this time, the first bias ΔV1 has a positive value and the voltage of the top electrode is less than the voltage of the bottom electrode. The second bias ΔV2 is 0 or has a negative value and the voltage of the top electrode is greater than the voltage of the bottom electrode.

Figure 9:
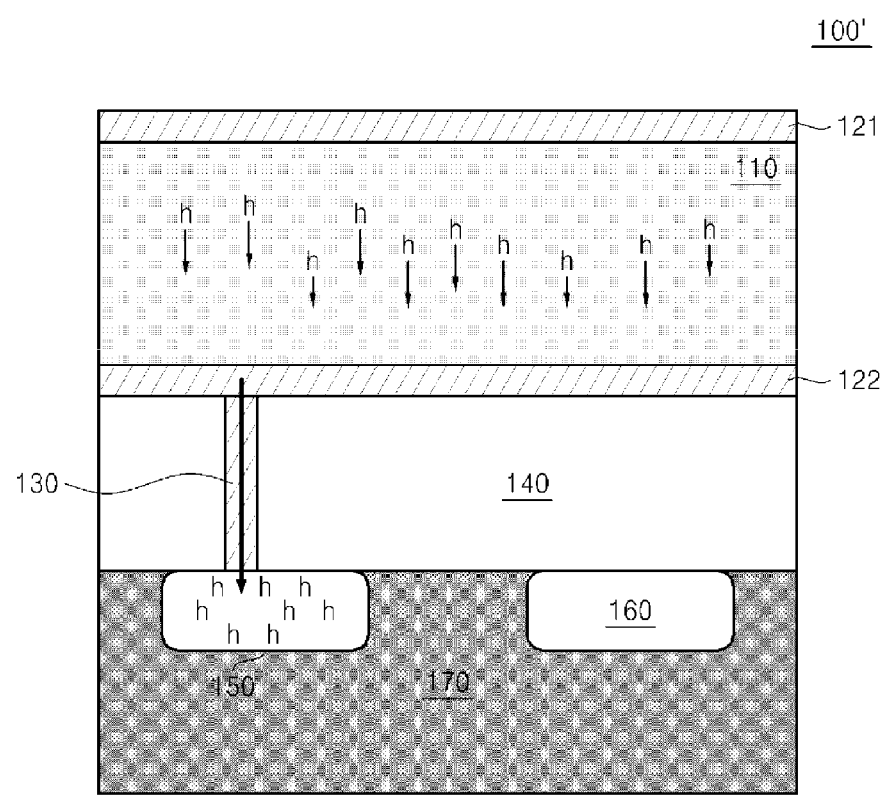
FIG. 9 is a cross-sectional view of a pixel according to further embodiments of the inventive concepts.

FIG. 9 is a cross-sectional view of a pixel 100' according to further embodiments of the inventive concepts. The pixel 100' has the same structure as the pixel 100 illustrated in FIG. 3. However, since a hole and an electron have opposite electrical polarities, bias changes for a global shutter operation is opposite to bias changes used when electrons are used in FIG. 3.

Figure 10:
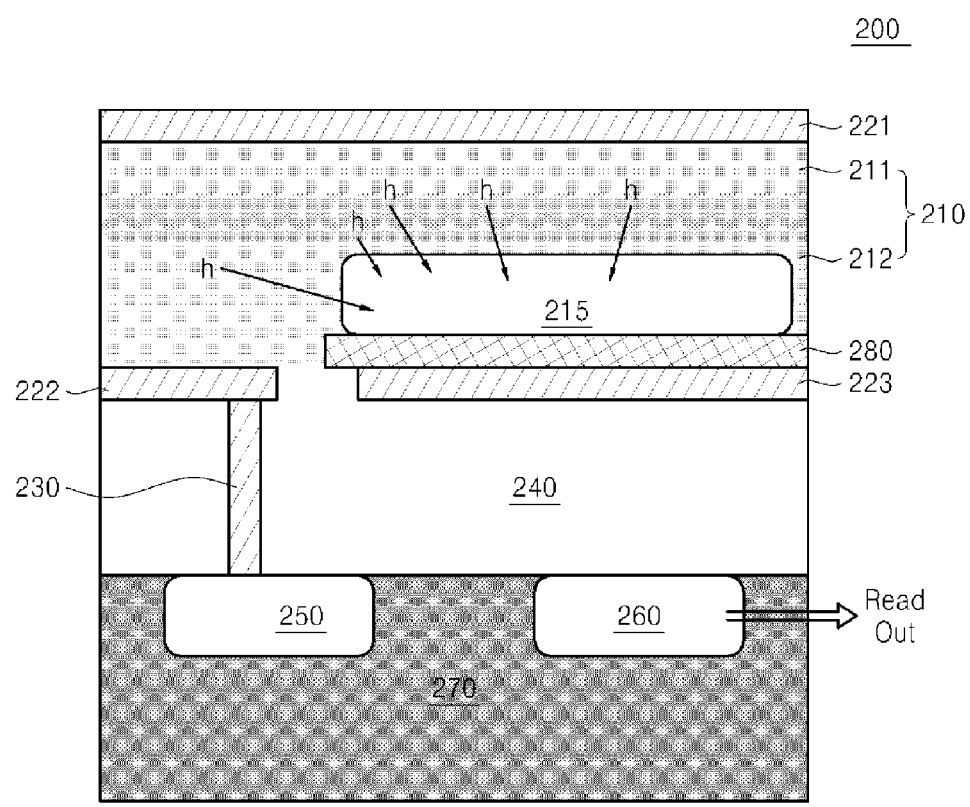
FIG. 10 is a cross-sectional view of a pixel according to other embodiments of the inventive concepts.

FIG. 10 is a cross-sectional view of a pixel 200' according to other embodiments of the inventive concepts. The pixel 200' has the same structure as the pixel 200 illustrated in FIG. 6. However, since a hole and an electron have opposite electrical polarities, bias changes for a global shutter operation is opposite to bias changes used when electrons are used.

Figure 11:
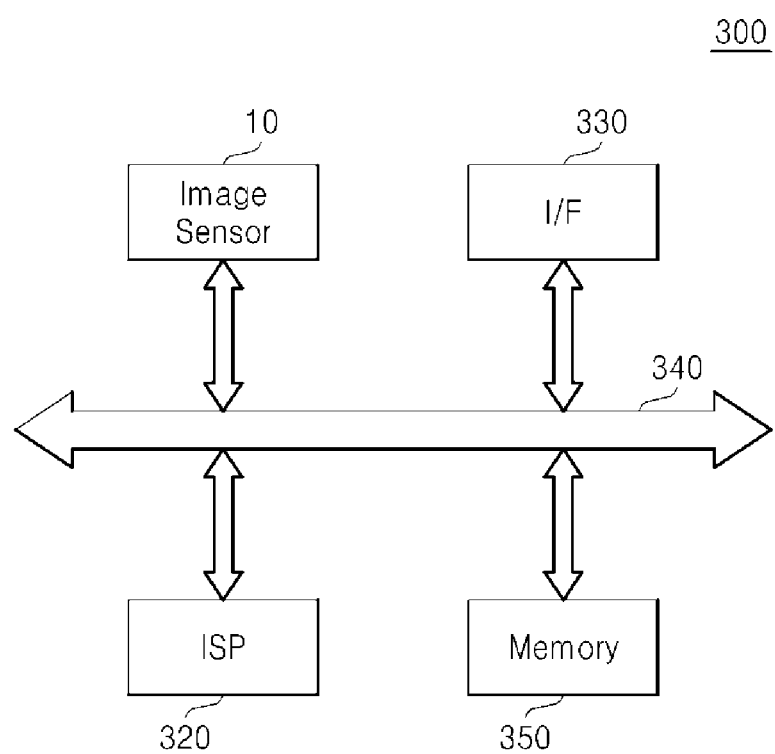
FIG. 11 is a block diagram of an electronic system including an image sensor according to some embodiments of the inventive concepts.

FIG. 11 is a block diagram of an electronic system including an image sensor according to some embodiments of the inventive concepts.

Referring FIG. 11, the electronic system 300 may be implemented as an image processing apparatus like a digital camera, a cellular phone equipped with a digital camera, or any electronic device equipped with a digital camera.

The electronic system 300 may include an image signal processor 320 controlling the operations of the image sensor 10.

The electronic system 300 may further include an interface 330. The interface 330 may be an input/output device.

Accordingly, the electronic system 300 may further include a memory device 350 storing still images captured according to the control of the image signal processor 320 or video data. The memory device 350 may be implemented as a non-volatile memory device. The non-volatile memory device may include a plurality of non-volatile memory cells.

Each of the non-volatile memory cells may be an electrically erasable programmable read-only memory (EEPROM), a flash memory, a magnetic RAM (MRAM), a spin-transfer torque MRAM, a Conductive bridging RAM(CBRAM), a ferroelectric RAM (FRAM), a phase-change RAM (PRAM), a resistive RAM (RRAM), a nanotube RRAM, a polymer RAM, a nano floating gate memory, a holographic memory, a molecular electronic memory device, or an insulator resistance change memory.

The semiconductor memory device 100 according to some embodiments of the present inventive concepts may be packed in various types of packages. For example, the various packages may include PoP(Package on Package), Ball grid arrays(BGAs), Chip scale packages(CSPs), Plastic Leaded Chip Carrier(PLCC), Plastic Dual In-Line Package(PDIP), Die in Waffle Pack, Die in Wafer Form, Chip On Board (COB), Ceramic Dual In-Line Package(CERDIP), Plastic Metric Quad Flat Pack(MQFP), Thin Quad Flatpack(TQFP), Small Outline(SOIC), Shrink Small Outline Package(SSOP), Thin Small Outline(TSOP), Thin Quad Flatpack(TQFP), System In Package(SIP), Multi Chip Package(MCP), Wafer-level Fabricated Package(WFP), Wafer-Level Processed Stack Package(WSP).

Figure 12:
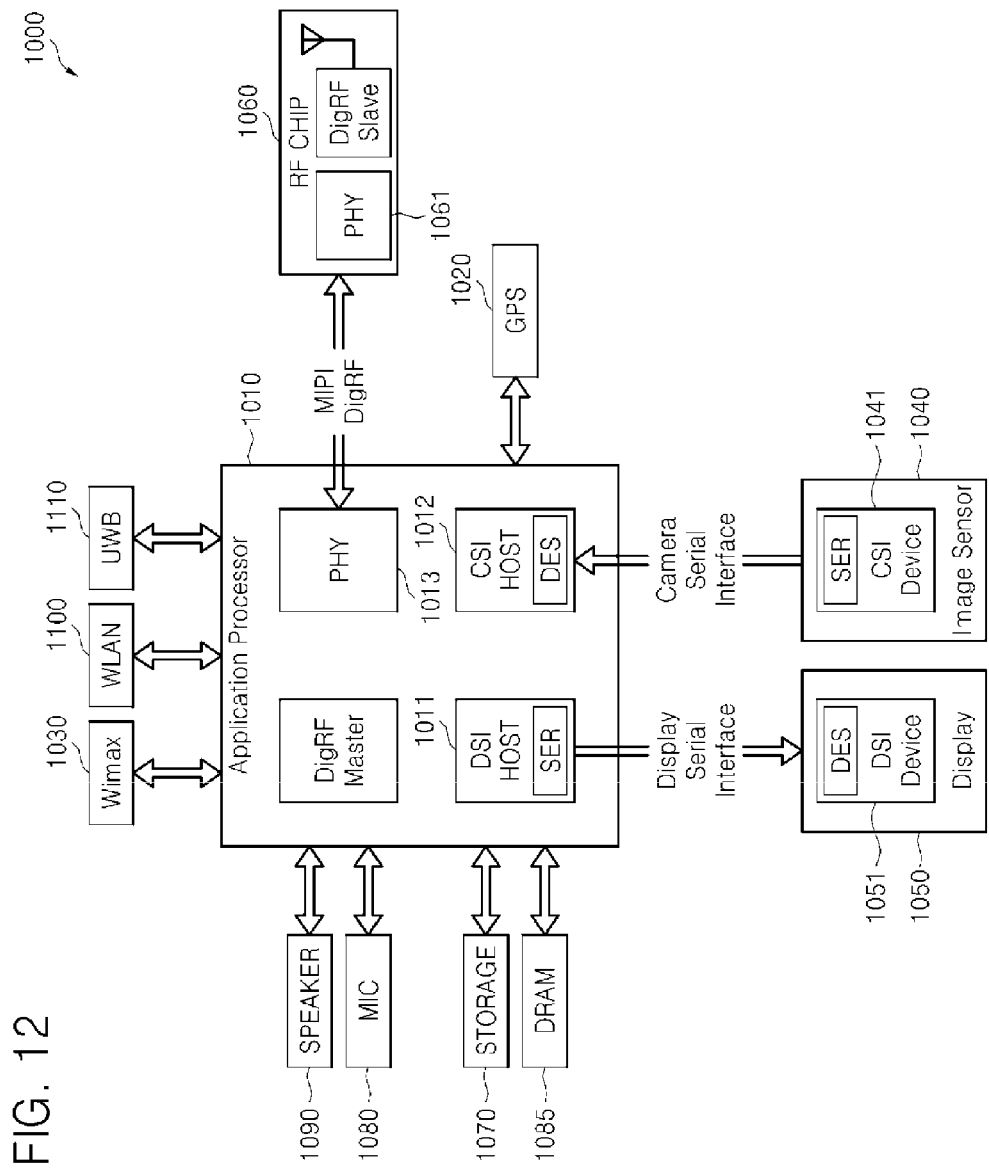
FIG. 12 is a block diagram of an electronic system including an image sensor according to other embodiments of the inventive concepts.

FIG. 12 is a block diagram of an electronic system including an image sensor according to other embodiments of the inventive concepts.

Referring FIG. 12, the electronic system 1000 may be implemented by a data processing apparatus, such as a mobile phone, a personal digital assistant (PDA), a portable media player (PMP), an IP TV, or a smart phone that can use or support the MIPI interface. The electronic system 1000 includes an application processor 1010, an image sensor 1040, and a display 1050.

A CSI host 1012 included in the application processor 1010 performs serial communication with a CSI device 1041 included in the image sensor 1040 through CSI. For example, an optical serializer may be implemented in the CSI host 1012, and an optical de-serializer may be implemented in the CSI device 1041.

A DSI host 1011 included in the application processor 1010 performs serial communication with a DSI device 1051 included in the display 1050 through DSI. For example, an optical serializer may be implemented in the DSI host 1011, and an optical de-serializer may be implemented in the DSI device 1051.

The electronic system 1000 may also include a radio frequency (RF) chip 1060 which communicates with the application processor 1010. A physical layer (PHY) 1013 of the electronic system 1000 and a PHY of the RF chip 1060 communicate data with each other according to a MIPI DigRF standard. The electronic system 1000 may further include at least one element among a GPS 1020, a storage device 1070, a microphone 1080, a DRAM 1085 and a speaker 1090. The electronic system 1000 may communicate using Wimax 1030, WLAN 1100 or USB 1110, etc.

As described above, according to some embodiments of the inventive concepts, an image sensor uses a photoelectric converter including an organic photoelectric conversion layer and a bias unit changing a bias, thereby realizing a global shutter operation without an increase of an area or a decrease of a fill factor without requiring an additional structure.

Since the global shutter operation is realized without the decrease of the fill factor, the quality of an image signal is secured to be at least a desired (or, alternatively a predetermined) level without decreasing the sensitivity of the image signal.

While the inventive concepts has been particularly shown and described with reference to exemplary embodiments thereof, it will be understood by those of ordinary skill in the art that various changes in forms and details may be made therein without departing from the spirit and scope of the inventive concepts as defined by the following claims.

What is claimed is:

1. An image sensor comprising:
   a semiconductor substrate;
   a photoelectric converter including,
      a bias unit including a first electrode and a second electrode that are formed separate from each other on the semiconductor substrate, and
      an organic photoelectric conversion layer configured to selectively absorb a quantity of light in a visible wavelength range and convert the light into charges through photoelectric conversion, the quantity of light absorbed being adjusted by a bias change of the bias unit;
   a via contacting the second electrode to connect the photoelectric converter with the semiconductor substrate;
   a storage node configured to store the charges; and
   a read-out unit formed within the semiconductor substrate configured to convert the charges transferred from the storage node into an image signal;
   wherein
   the bias unit further includes,
      a third electrode provided parallel to the first electrode, the third electrode separated from the first electrode and the second electrode, the third electrode configured to receive a separate voltage, and an insulation layer provided between the third electrode and the organic photoelectric conversion layer.

2. The image sensor of claim 1, wherein the bias unit is configured to adjust the quantity of light absorbed sequentially in units of pixels in the pixel array, adjust the quantity of light absorbed sequentially in units of rows in the pixel array, or adjust the quantity of light absorbed in order.

3. The image sensor of claim 1, wherein the charges are holes or electrons.

4. The image sensor of claim 3, wherein the storage node is formed in a potential well created by bias changes occurring in at least two of the first through third electrodes, the organic photoelectric conversion layer is configured to transmit the holes to the storage node through the via, if a first bias voltage is formed between the first electrode and the second electrode,
the organic photoelectric conversion layer is configured to stop transmitting the holes to the storage node, if a second bias voltage is formed between the first and second electrodes, and
the storage node is configured to transmit the holes to the read-out unit, if the semiconductor substrate has a lower voltage than the second electrode.

5. The image sensor of claim 4, wherein
the first bias voltage is lower than zero, if a voltage of the first electrode is higher than a voltage of the second electrode, and
the second bias voltage is higher than or equal to zero, if the voltage of the first electrode is lower than or equal to the voltage of the second electrode.

6. The image sensor of claim 1, wherein the quantity of light absorbed by the organic photoelectric conversion layer is adjusted by varying a potential energy difference between the first and second electrodes, the second and third electrodes, the first and third electrodes, and the second electrode and the semiconductor substrate.

7. The image sensor of claim 6, wherein the storage node is formed within the organic photoelectric conversion layer,
the holes generated in the organic photoelectric conversion layer are transferred to the storage node, if the potential energy difference between the first and second electrodes is less than zero and greater than the potential energy difference between the first and third electrodes, and the potential energy difference between the second and third electrodes is less than zero,
the holes stored in the storage node remain in the storage node, if the potential energy difference between the first and second electrodes is greater than zero and greater than the potential energy difference between the first and third electrodes, and the potential energy difference between the second and third electrodes is greater than zero, and
the electrons in the storage node are transferred to the read-out unit through the via, if the potential energy difference between the first and second electrodes is less than zero and less than the potential energy difference between the first and third electrodes, the potential energy difference between the second and third electrodes is greater than zero and greater than the potential energy difference between the first and second electrodes, and the potential energy difference between the second electrode and the semiconductor substrate is less than zero.

8. The image sensor of claim 1, wherein the organic photoelectric conversion layer is configured to absorb a different quantity of light according to the bias change in a wavelength range depending on an organic material used to form the organic photoelectric conversion layer.

9. The image sensor of claim 1, wherein the organic photoelectric conversion layer comprises at least one of a red pixel photoelectric conversion layer, a green pixel photoelectric conversion layer, and a blue pixel photoelectric conversion layer, and
a plurality of photoelectric converters disposed adjacent to one another in a horizontal direction or in a vertical direction, each of the plurality of photoelectric converters comprising at least one of the red, green and blue pixel photoelectric conversion layers and the bias unit.

10. The image sensor of claim 1, wherein the first and second electrodes in the bias unit are formed using one of a transparent oxide and a transparent thin metal film.

11. An electronic device comprising:
the image sensor of claim 1 configured to generate image information; and
an image signal processor configured to process the image information.

12. The image sensor of claim 1 further comprising an intermediate insulating layer provided between the photoelectric converter and the semiconductor substrate.

13. A method of operating an image sensor that includes a semiconductor substrate, a pair of electrodes formed parallel to each other on the semiconductor substrate, and an organic photoelectric conversion layer formed between the pair of electrodes, the pair of electrodes including a first electrode and a second electrode, the method comprising:
selectively absorbing in the organic photoelectric conversion layer a quantity of light in a visible wavelength range by changing a bias between the pair of electrodes; and
generating an image signal by accumulating and reading out charges, in accordance with the change in the bias between the pair of electrodes, wherein
the image sensor further includes,
a third electrode provided parallel to the first electrode, the third electrode separated from the first electrode and the second electrode, the third electrode configured to receive a separate voltage,
an insulation layer provided between the third electrode and the organic photoelectric conversion layer.

14. The method of claim 13, wherein the voltages of the first, second and third electrodes are set either sequentially in units of pixels in a pixel array, sequentially in units of rows in the pixel array, or in order.

15. The method of claim 13, wherein the charges are holes or electrons.

16. The method of claim 15, wherein the generating comprises:
accumulating and storing the holes if the pair of electrodes have a first bias;
stopping the accumulation, if the pair of electrodes have a second bias; and
reading out the stored holes, if the semiconductor substrate has a lower voltage than a closest one of the pair of electrodes.

17. The method of claim 16, wherein
the first bias is a voltage level where a voltage of the first electrode of the pair of electrodes is greater than a voltage of the second electrode of the pair of electrodes, and
the second bias is a voltage level where the voltage of the first electrode is less than the voltage of the second electrode.

18. The method of claim 13, wherein the quantity of light absorbed by the organic photoelectric conversion layer varies according to the voltages of the first and second electrodes and an organic material used to form the organic photoelectric conversion layer.

19. An image sensor comprising:
a lens configured to receive an image; and
a pixel array configured to demodulate the image into charges representing image information, the pixel array including a plurality of pixels, each of the plurality of pixels including,
  a photoelectric converter configured to adjust a quantity of photons that are converted into the charges, the photoelectric converter including,
    a bias unit including at least first and second electrodes formed parallel to each other and configured to generate a bias voltage therebetween, and
    a photodiode formed between the first and second electrodes, the photodiode configured to convert the quantity of photons received into the charges through photoelectric conversion based on the bias voltage, and
  a plurality of storage nodes configured to store the charges, and
  a plurality of read out units, each of the read out units configured to amplify the charges to form an image signal, wherein
the bias unit further includes,
  a third electrode provided parallel to the first electrode, the third electrode separated from the first electrode and the second electrode, the third electrode configured to receive a separate voltage, and
  an insulation layer provided between the third electrode and the organic photoelectric conversion layer.

20. The image sensor of claim 19, wherein a via is formed between the second electrode and a respective one of the storage nodes and configured to transfer the charges therebetween, the second electrode being closer to the storage node than the first electrode, and
the storage node is configured to receive the charges, if the storage node has a lower potential than the second electrode.

21. The image sensor of claim 20, wherein the charges are transferred from the storage node to the read out unit, if the transfer transistor is on and the read out unit has a lower potential than the second electrode.

* * * * *